United States Patent
Anzai

(10) Patent No.: US 6,323,551 B1
(45) Date of Patent: Nov. 27, 2001

(54) RESIN SEALED-TYPE SEMICONDUCTOR DEVICE AND METHOD OF MANUFACTURING THE SAME

(75) Inventor: Noritaka Anzai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/071,864

(22) Filed: May 4, 1998

(30) Foreign Application Priority Data

Oct. 27, 1997 (JP) .................................................. 9-294484

(51) Int. Cl.⁷ .................................................. H01L 23/02
(52) U.S. Cl. .......................... 257/737; 257/668; 257/778; 257/787
(58) Field of Search .................................... 438/613, 614, 438/616, 617, 108, 118, 123, 127, 124; 257/778, 787, 737, 738, 783, 780, 793

(56) References Cited

U.S. PATENT DOCUMENTS

| | | | |
|---|---|---|---|
| 5,157,480 | * 10/1992 | Mcshane et al. ..................... | 257/737 |
| 5,668,405 | * 9/1997 | Yamashita ............................. | 257/668 |
| 5,739,585 | * 4/1998 | Akram et al. ......................... | 257/698 |
| 5,894,107 | * 4/1999 | Lee et al. .............................. | 257/778 |

* cited by examiner

Primary Examiner—Mary Wilczewski
(74) Attorney, Agent, or Firm—Volentine Francos, PLLC

(57) ABSTRACT

On a semiconductor element in the which a circuit pattern and electrodes are formed on a circuit forming surface, a plurality of leads, which are formed by a strip-shaped metal piece having a rectangular exposed portion, are disposed in parallel at predetermined intervals and are electrically connected to each of the electrodes. Molding is effected by a resin so as to cover portions of the plurality of leads other than the exposed portions and to cover the circuit forming surface and side surfaces of the semiconductor element. Flux for soldering is applied to at least one of spherical solders and the exposed portions. The spherical solder is disposed one by one on each of the exposed portions so as to form a zigzag in a direction in which the plurality of leads are arranged. The solder is heated and melted such that the solder bump which covers the entire surface of the rectangular exposed portion is formed by the melted solder.

16 Claims, 3 Drawing Sheets

RESIN SEALED-TYPE SEMICONDUCTOR DEVICE AND METHOD OF MANUFACTURING THE SAME

BACKGROUND OF THE INVENTION

1. Field of the Invention

The present invention relates to a resin sealed-type semiconductor device, in which a semiconductor element and a lead for external connection are molded by a resin, and a method of manufacturing the same.

2. Description of the Related Art

With the advancement of an IC (integrated circuit) card and a memory card, it is requested that a semiconductor device which is incorporated into the card be thin and small. An example of the thin and small semiconductor device is a structure called CPS (chip size package) and the well-known example is described in Japanese Patent Application Laid-Open (JP-A) No. 9-17910. JP-A No. 9-17910 discloses a structure in which a lead frame is fixed to a semiconductor element, an electrode of the semiconductor element and the lead frame are connected electrically, a portion of the lead frame is sealed by a resin, and an outer terminal is provided on the surface of the lead frame which is not sealed by the resin.

However, the conventional resin sealed-type semiconductor device has following drawbacks.

When the pitch between the leads is narrow, the size of a solder bump which can be formed on the lead becomes small and the amount of solder is reduced. As a result, when the semiconductor device is disposed on a printed board and connected thereto, relaxation of stress by the solder is not sufficient and cracking may be formed on the solder bump which connects the printed board and the semiconductor device. In a case in which the solder bump is used in a severe temperature environment, the stress is directly and repeatedly applied to the solder bump due to the difference between the coefficient of thermal expansion of the portion sealed by the mold resin and the coefficient of thermal expansion of the printed board. The cracking is thereby generated due to the occurrence of brittle fracture on the solder bump.

Further, the solder bumps are formed in column of files on the plurality of leads and the distance between the solder bumps is short. As a result, if the pitch between the leads is narrow, the melted solder bumps contact at the time of mounting to the printed board or the like. Accordingly, a short circuit may occur between the adjacent leads.

Moreover, in a stage in which a product using the semiconductor device is manufactured, soldering is effected by heating the product in a reflow device at about 300° C., and thereafter, when the product is cooled to an ordinary temperature, the stress is generated due to the difference between the coefficient of contraction of the sealed portion and the coefficient of contraction of the printed board. Consequently, cracking may be generated on the solder bump which has become especially fragile in the cooling process. It is difficult to find such cracking on the product during the inspection immediately after the product is manufactured, and the defective product may be shipped as a good item.

SUMMARY OF THE INVENTION

The present invention has solved the drawbacks of the above-described conventional art, and the object thereof is to provide a resin sealed-type semiconductor device, which can be reliably connected to a printed board or the like, and a method of manufacturing the same.

In order to achieve the above-described object, a first aspect comprises: a semiconductor element in which a circuit pattern and a plurality of electrodes for electrically connecting the circuit to the exterior are formed on a circuit forming surface of a semiconductor board; a plurality of leads which are formed of a strip-shaped metal piece and each of which includes a rectangular exposed portion for connecting to the exterior electrically and mechanically, the leads being disposed on a plane surface at predetermined intervals so that the long edges of the exposed portions are in parallel, and each of the leads being electrically connected to each of the electrodes of the semiconductor element; a sealing portion which is molded by a resin such that the sealing portion covers at least portions of the plurality of leads other than the exposed portions and the circuit forming surface of the semiconductor element, and a plurality of solder bumps which have a predetermined height and are provided so as to cover the entire surface of the exposed portion of each of the plurality of leads.

In accordance with the first aspect, the exposed portions of the plurality of leads are rectangular and the solder bumps having predetermined height are provided so as to cover the entire surfaces of the exposed portions. Accordingly, for example, when a resin sealed-type semiconductor device is disposed on a printed board or the like, the device can be reliably connected thereto electrically and mechanically.

A second aspect comprises: a semiconductor element in which a plurality of electrodes is formed on the surface; a plurality of inner leads which are disposed on the surface of the semiconductor element and which are connected to the electrodes, respectively; a sealing resin which exposes an area of each of the inner leads which is long in the extending direction and seals the plurality of inner leads and the surface of the semiconductor element; and a plurality of convex outer terminals which are formed on the exposed area of each of the inner leads.

The outer terminals of the second aspect can cover substantially the entire surfaces of the exposed areas of the inner leads. Further, the outer terminals of the second aspect can form substantially elliptical convex configurations. The entire surfaces of the exposed portions can be covered by the outer terminals having substantially elliptical configurations.

A third aspect comprises: a semiconductor element in which a plurality of electrodes are formed on the surface; a plurality of inner leads which are disposed on the surface of the semiconductor element and which are connected to the electrodes, respectively; a sealing resin which exposes an area of each of the inner leads which is long in the extending direction and seals the plurality of inner leads and the surface of the semiconductor element; and a plurality of outer electrodes which are formed on the exposed area of each of the inner leads, the outer electrodes which are adjacent to each other being disposed at positions which are different distances away from the distal ends of the inner leads.

As described above, the exposed areas of the third aspect are rectangular and can be disposed on the plane surface at predetermined intervals so that the long edges of the rectangular areas are in parallel.

In this way, because the outer electrodes which are adjacent to each other are disposed in the exposed areas of the inner leads at the positions which are different distances away from the distal ends of the inner leads, even if the pitch between the adjacent leads is narrow, the outer electrodes can be formed without generating a short circuit and the resin sealed-type semiconductor device can be made more compact.

In the above-described aspects, the sealing portion covers the portions of the plurality of leads other than the exposed portions, and the circuit forming surface and the side surfaces of the semiconductor element. Also, molding can be effected by the resin so as to expose the reverse surface of the semiconductor device. Due to the exposure of the reverse surface of the semiconductor element, good heat dissipation can be obtained.

As described in a fourth aspect, a method of manufacturing the above-described resin sealed-type semiconductor device, comprising the steps of: manufacturing a resin sealed-type semiconductor device, which comprises (a) a semiconductor element in which a circuit pattern and a plurality of electrodes for electrically connecting the circuit to the exterior are formed on a circuit forming surface of a semiconductor board, (b) a plurality of leads which are formed of a strip-shaped metal piece and each of which includes a rectangular exposed portion for connecting to the exterior electrically and mechanically, the leads being disposed on a plane surface at predetermined intervals so that the long edges of the exposed portions are in parallel, and each of the leads being electrically connected to each of the electrodes of the semiconductor element, (c) a sealing portion which is molded by a resin such that the sealing portion covers at least portions of the plurality of leads other than the exposed portions and the circuit forming surface of the semiconductor element; applying flux for soldering to at least one of spherical solders for forming solder bumps and the exposed portions; disposing the spherical solder one by one on each of the exposed portions such that the spherical solders form a zigzag in a direction in which the plurality of leads are arranged; and heating and melting the solder and forming a solder bump which covers the entire surface of the rectangular exposed portion by the melted solder.

Further, as described in a fifth aspect, a method of manufacturing a resin-sealed type semiconductor device, comprising the steps of: disposing a plurality of inner leads on the surface of a semiconductor element in which a plurality of electrodes are formed on the surface, and connecting the plurality of electrodes and the plurality of inner leads, respectively; exposing an area of each of the inner leads which is long in the extending direction, and sealing the plurality of inner leads and the surface of the semiconductor element by a sealing resin; forming outer electrodes on the exposed area of each of the inner leads so that the adjacent outer electrodes are arranged alternately; and melting the outer electrodes so as to form convex configurations, e.g., substantially elliptical configurations, along the exposed areas of the inner leads.

In this case, the plurality of leads are subjected to thermo-compression bonding while an adhesive tape is interposed between the lead and the semiconductor element, such that the leads are disposed on the surface of the semiconductor element.

In accordance with the fourth and the fifth aspects, the solders for forming solder bumps or the outer electrodes are disposed zigzag, i.e., alternately, and melted so as to form the solder bumps or the outer electrodes. Accordingly, even if the pitch between the adjacent leads is narrow, the solder bumps or the outer electrodes can be formed without generating a short circuit, and the resin sealed-type semiconductor device can be made more compact.

DESCRIPTION OF THE PREFERRED EMBODIMENTS

Figure 1A:
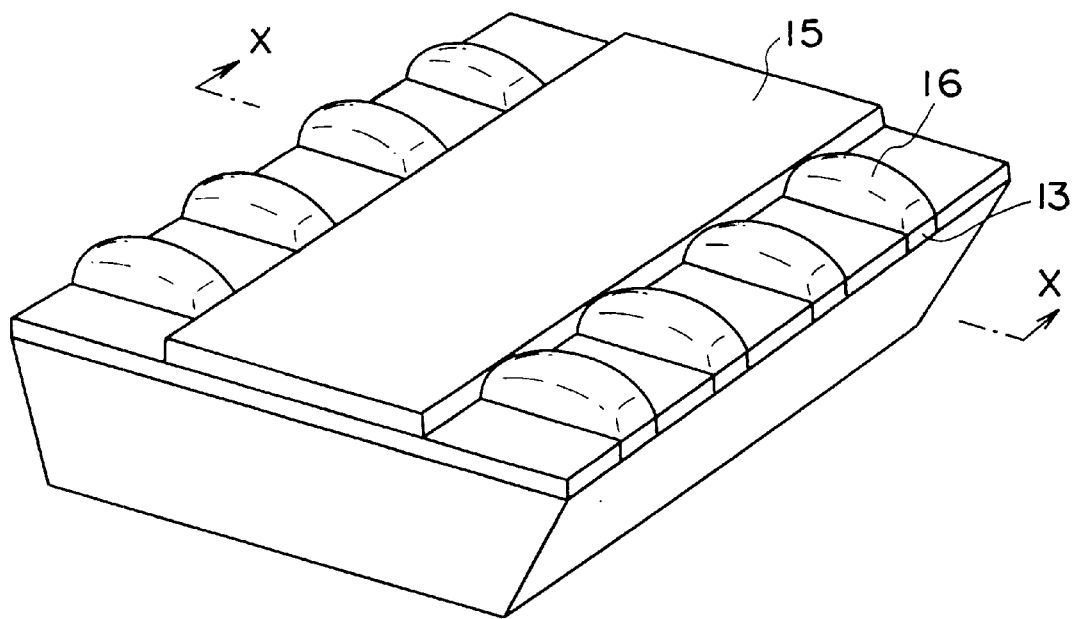
FIG. 1A is a structural view of a resin sealed-type semiconductor device which shows an embodiment of the present invention.
Figure 1B:
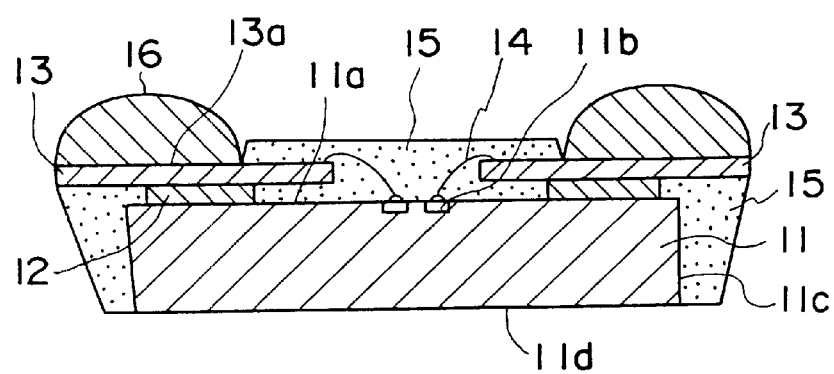
FIG. 1B is a structural view of a resin sealed-type semiconductor device which shows an embodiment of the present invention.

FIGS. 1A and 1B are structural views of a resin sealed-type semiconductor device which shows an embodiment of the present invention. FIG. 1A is a perspective view which shows an appearance of the semiconductor device, and FIG. 1B is a cross-sectional view of the semiconductor device, taken along line X—X in FIG. 1A.

The semiconductor device includes a semiconductor element 11 having a circuit forming surface 11a in which a circuit pattern is formed on a semiconductor board. A plurality of electrodes 11b for connecting the circuit to an exterior are formed at the central portion of the circuit forming surface 11a. The peripheral portion of the circuit forming surface 11a are provided with an insulated adhesive tape 12, which is based on, for example, polyimide, in which both surfaces of the polyimide are coated by thermoplastic resin, and which has a predetermined thickness. A plurality of strip-shaped leads 13, which has a width of about 0.42 mm, are disposed in parallel at a pitch of, e.g., 1.27 mm. One of the surfaces of the lead 13 is adhered to the circuit forming surface 11a side via the adhesive tape 12.

The lead 13 is a leader line for mounting the semiconductor device to the printed board or the like and connecting them electrically and mechanically. The lead 13 is formed by a metal plate which is made of, e.g., an Fe—Ni alloy or the like and has a thickness of about 0.1 mm. Unlike a pin of a conventional flat package or the like, the lead 13 does not project long and outwardly to the exterior of the semiconductor element 11. In order to decrease the size of the semiconductor device itself, the lead 13 is cut to lengths so as to be accommodated within the plane of the circuit forming surface 11a.

Plating for soldering (e.g., silvering) is effected on one end at the inner side of the lead 13. The plating and the electrode 11b of the semiconductor element 11 are electrically connected by a wire 14 such as a metal wire. Further, on the other surface of the lead 13 which is disposed at the peripheral portion of the semiconductor element 11, a rectangular portion having, e.g., a width of 0.42 mm and a length of 0.86 mm is remained as an exposed portion 13a for external connection. A portion of the lead 13 other than the exposed portion 13a, the circuit forming surface 11a and the side surface 11c of the semiconductor element 11, and a plurality of wires 14 are sealed by a sealing portion 15 which is formed of a mold resin such as epoxy and the like. On the other hand, in order to increase the effect of heat dissipation, a reverse surface 11d of the semiconductor element 11 which is at the side opposite the circuit forming surface 11a is bare and not sealed by the mold resin.

Further, an elliptical solder bump 16 is formed on the entire surface of the exposed portion 13a of the lead 13 so that the solder bump 16 is higher than the sealing portion 15, which is molded on the circuit forming surface 11a, by a predetermined length. For example, if the height of the sealing portion 15 is about 0.15 mm, the height of the solder bump 16 is about 0.3 to 0.5 mm.

The semiconductor device is manufactured in accordance with, for example, the following processes (1) through (7).

(1) Process 1

Figure 3A:
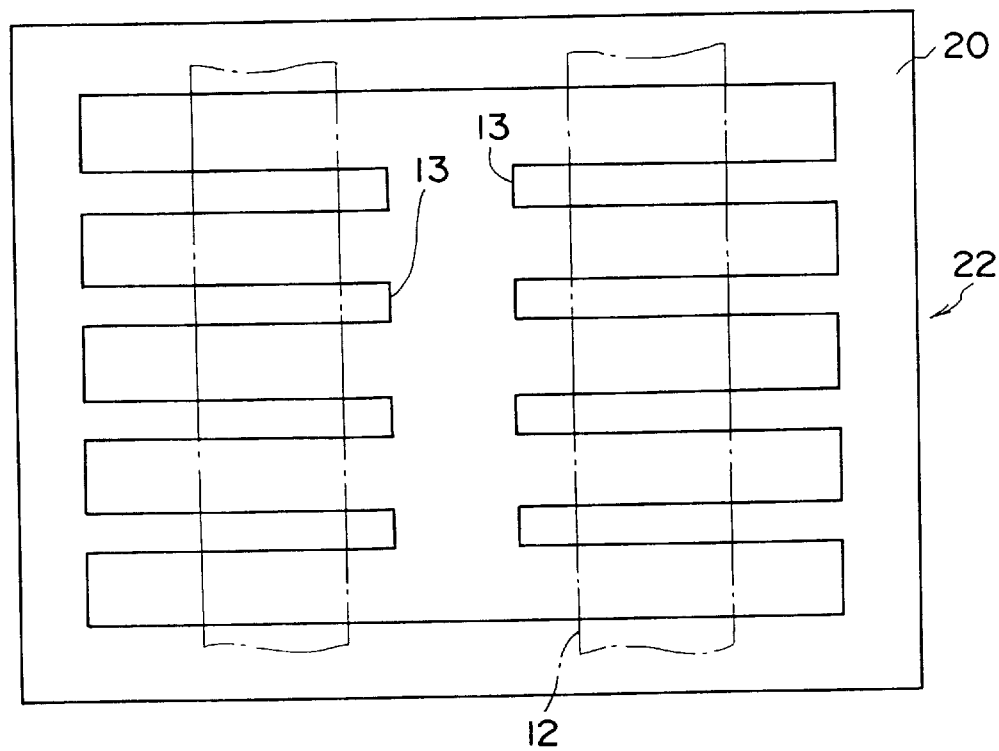
FIG. 3A is a diagram which shows a procedure of manufacturing the semiconductor device.

Firstly, a metal plate which is formed of Fe—Ni alloy or the like and has a thickness of 0.1 mm is punched so as to manufacture, as shown in FIG. 3A, a lead frame 22 which has a frame portion 20 and a plurality of comblike leads 13, which extends inwardly from the frame portion 20. The width, the length, the pitch, and the number of lead 13 in the lead frame 22 is the same as those of the plurality of leads 13 in the resin sealed-type semiconductor device in FIG. 1. Namely, when the frame portion 20 of the lead frame 22 is cut out, the leads 13 within the lead frame 22 finally remain as the leads 13 in the semiconductor device. Silvering for soldering is effected on the distal end portion of the lead 13 in the lead frame 22.

(2) Process 2

Figure 3B:
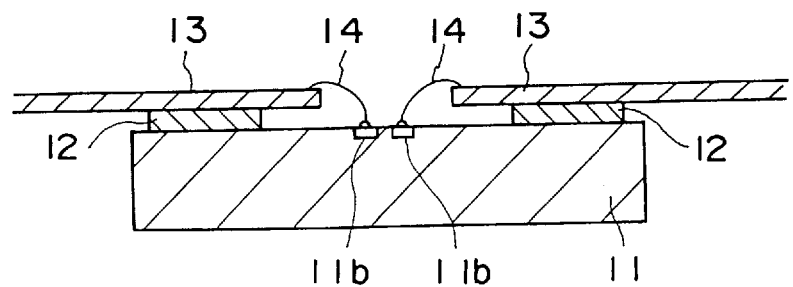
FIG. 3B is a diagram which shows a procedure of manufacturing the semiconductor device.

The adhesive tape 12 is adhered to the reverse surface of the lead 13 in the lead frame 22. Moreover, the circuit forming surface 11a of the semiconductor element 11 is subjected to thermo-compression bonding to the adhesive tape 12 at about 400° C. After the lead 13 and the semiconductor element 11 are adhered, as shown in FIG. 3B, the silvered distal end portion of the lead 13 and the electrode 11b of the semiconductor element 11 are connected by the wire 14.

(3) Process 3

Figure 3C:
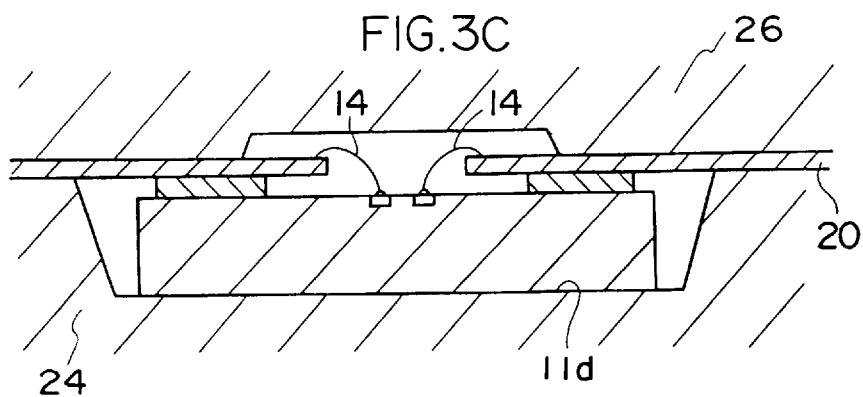
FIG. 3C is a diagram which shows a procedure of manufacturing the semiconductor device.

As shown in FIG. 3C, the lead frame 22, to which the semiconductor element 11 is attached, is mounted to a lower metal mold 24 for molding at a predetermined position. The lower metal mold 24 is slightly wider than the circuit forming surface 11a and has substantially the same concave portion. The depth of the concave portion corresponds exactly to the combined thickness of the semiconductor element 11 and the adhesive tape 12. In this way, the reverse surface 11d of the semiconductor element 11 is adhered to the bottom surface of the concave portion of the lower metal mold 24. The frame portion 20 of the lead frame 22 is mounted so as to adhere to a stand portion of the lower metal mold 24.

Next, an upper metal mold 26, which forms the pair to the lower metal mold 24, covers the lower metal mold 24 at a predetermined position. The upper metal mold 26 has a concave portion, which has a predetermined depth and whose opening portion is smaller than that of the concave portion of the lower metal mold 24, such that the upper metal mold 26 forms a mold which protects the wires 14 jutting out from the surface of the lead frame 22.

The lead frame 22 is mounted to the upper and lower metal molds 24 and 26, and thereafter, a liquid mold resin such as epoxy or the like is injected from an inlet.

(4) Process 4

After the mold resin is cured, the semiconductor element 11 which has been molded in the sealing portion 15 is removed and the unnecessary portion of the lead frame 22 is cut out.

(5) Process 5

Flux for soldering is applied to the exposed portion 13a of the lead 13.

(6) Process 6

A spherical solder (e.g., a solder ball) 17 having a diameter of about 0.5 to 0.6 mm is disposed one by one and zigzag on the exposed portion 13a of the lead 13 so that the adjacent solder balls 17 do not contact and are placed far away from each other.

Figure 2:
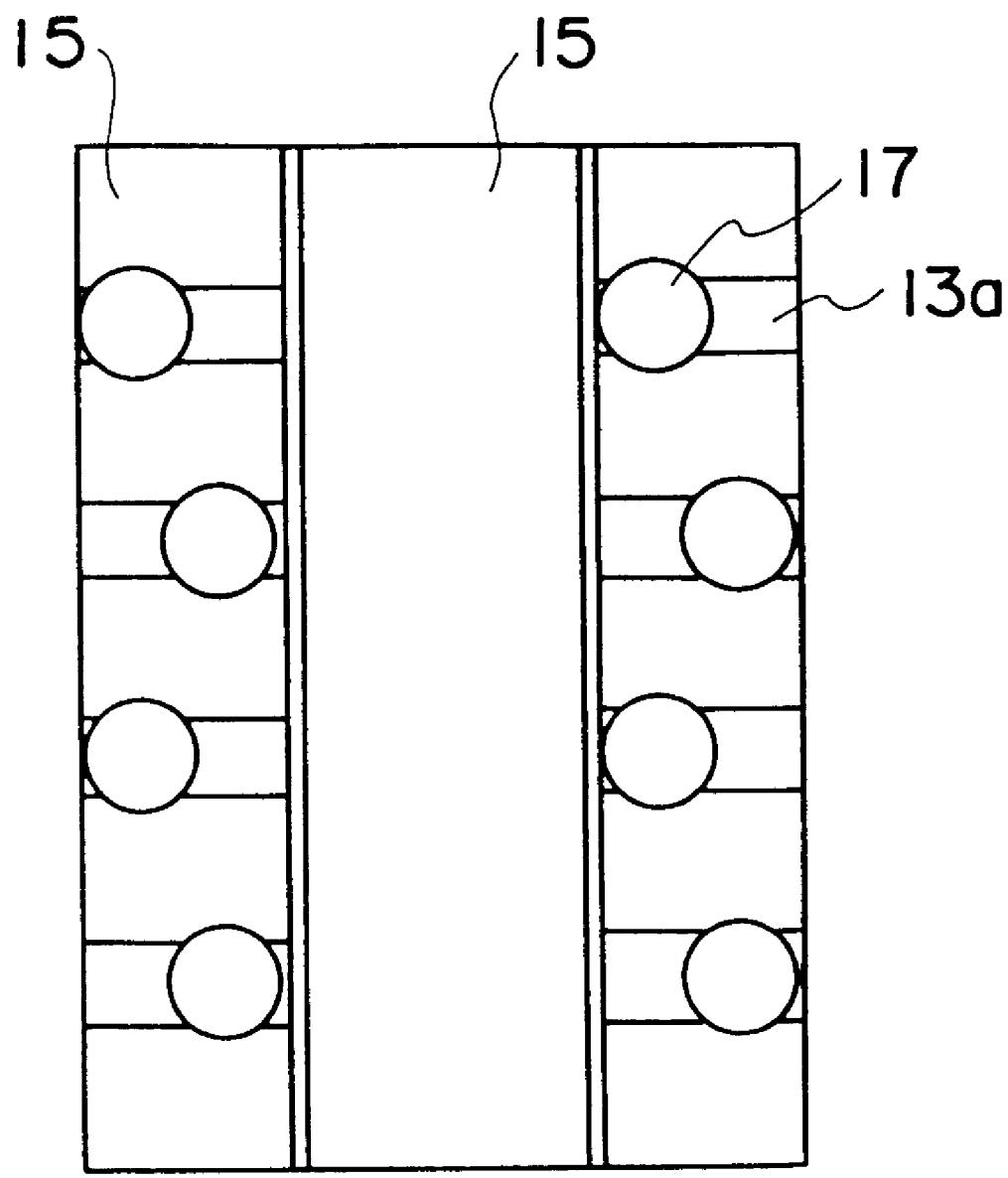
FIG. 2 is a plan view showing a state of a solder ball which is disposed on a lead in Process 6.

FIG. 2 is a plan view which shows a state in which the solder balls 17 are disposed on the exposed portions 13 in Process 6.

(7) Process 7

The semiconductor device, at which the solder balls 17 are disposed, is placed in a heating furnace and heated at, e.g., 240° C., such that the disposed solder balls 17 are melted.

In this way, the melted solder spreads over the entire surface of the exposed portion 13a of the lead 13 and the elliptical solder bump 16 is formed due to the surface tension of the solder. The resin sealed-type semiconductor device as shown in FIG. 1A is completed.

The semiconductor device which is manufactured in accordance with the above processes is mounted to, for example, a printed board and connected to the outer circuit via the solder bump 16. A signal applied from the exterior is guided to the semiconductor element 11 through the lead 13 and the wire 14. Further, the output signal of the semiconductor element 11 is output to the outer circuit through the wire 14, the lead 13, and the solder bump 16.

The semiconductor device is mounted to the printed board in accordance with the following procedure.

The flux for soldering is applied onto a foot print on a surface at which the components of the printed board are disposed by, for example, screen printing or the like. The semiconductor device is disposed with the reverse surface 11d of the semiconductor element 11 being upside down so that the solder bump 16 contacts the foot print. After the semiconductor device is disposed, the printed board is placed in a reflow device and heated at about 300° C. The solder bump 16 is melted and soldering is carried out.

As described above, the resin sealed-type semiconductor device and the method of manufacturing the same of the present embodiment has the following advantages (i) to (iii).

(i) Because the exposed surface 13a of the lead 13 is rectangular, the solder ball 17 can be disposed zigzag at the time of formation of the solder bump 16. In this way, a short circuit due to the contact of the adjacent solder balls 17 will not occur between the leads 13, the pitch between the leads 13 can be narrow, and the semiconductor device can be made more compact.

(ii) Since the solder ball 17 is disposed zigzag, the adjacent solders do not contact even if the relatively large solder balls 17 are disposed, and the solder bump 16 having a relatively large amount of solder can be formed. In this way, when the semiconductor device is disposed on the printed board or the like, the stress applied to the solder bump 16 is dispersed and there is no worry that cracking be generated on the solder bump 16.

(iii) Because the reverse surface 11d of the semiconductor element 11 is bare and not subjected to mold-sealing, heat dissipation of the device is good.

The present invention is not limited to the above-described embodiment and various types of variations are possible. The variant examples are described, for example, in the following (a) to (h).

(a) The resin sealed-type semiconductor device in FIG. 1 includes eight leads 13. However, the number of lead 13 is not limited to the same and any number is possible provided that the number of lead 13 corresponds to and is needed by the circuit formed on the semiconductor element 11. Further, the place at which the lead 13 is provided is not limited to the two edges as shown in FIG. 1. The lead 13 may be provided at four edges around the circuit forming surface 11a of the semiconductor element 11.

(b) Instead of using the adhesive tape 12, the lead 13 may be connected to the semiconductor element 11 by using an insulating adhesive agent having a predetermined thickness.

(c) The electrode 11b and the lead 13 are connected by the wire 14. However, instead of the wire 14, a conductive adhesive agent or the like may be used for connecting the two.

(d) Processes (1) to (7) are an example of explaining more concretely the structure of the resin sealed-type semiconductor device in FIG. 1, and the present invention is not limited to the method described in the manufacturing processes. For example, instead of punching the metal plate and manufacturing the lead frame, it is possible that the separate lead 13 be manufactured at first and then disposed on a paper tape or the like at predetermined intervals.

(e) Materials of the adhesive tape 12, the lead 13, the wire 14, and the like are not limited to the above-described materials. Appropriate materials may be selected in consideration of cost and manufacturing method.

(f) The reverse surface 11d of the semiconductor element 11 is not subjected to molding. However, if it is necessary to insulate the reverse surface 11d electrically, the reverse surface 11d may be subjected thereto. In this case, heat dissipation may be slightly deteriorated due to the type and thickness of the mold resin.

(g) In Process 5, the flux for soldering is applied to the exposed portion 13a of the lead 13. However, the flux may be applied to the solder ball 17.

(h) In the resin-sealed type semiconductor device in FIG. 1, the sealing portion 15 is higher than the exposed surface 13a of the lead 13. However, the configuration is not limited to this. For example, it is possible that the inner end portion of the lead 13 be bent to the semiconductor element 11 side, that the bent portion of the lead 13 and the semiconductor element 11 be connected by the wire 14, and that the height of the surface of the sealing portion 15 be the same as the height of the exposed portion 13a of the lead 13.

What is claimed is:

1. A resin sealed-type semiconductor device, comprising:

a semiconductor element;

a plurality of electrodes formed on a surface of the semiconductor element;

a plurality of leads disposed on the surface of the semiconductor element and connected to the electrodes, respectively;

a sealing resin which exposes an area of each of the leads which is long in an extending direction and seals the plurality of leads and the surface of the semiconductor element; and a plurality of convex outer terminals formed on the exposed area of each of the leads and disposed over the surface of the semiconductor element.

2. The resin sealed-type semiconductor device according to claim 1, wherein the outer terminals respectively cover substantially entire surfaces of the exposed areas of the leads.

3. The resin sealed-type semiconductor device according to claim 1, wherein the sealing resin exposes the respective area of each of the leads which is long in the extending direction, and the sealing resin seals the plurality of leads, and the surface and side surfaces of the semiconductor element.

4. The resin sealed-type semiconductor device according to claim 1, wherein the outer terminals are adjacent to each other and are disposed at positions which are different distances away from distal ends of the leads.

5. The resin sealed-type semiconductor device according to claim 1, further comprising:

an insulated adhesive layer provided between the semiconductor element and the leads.

6. The resin sealed-type semiconductor device according to claim 1, wherein the plurality of electrodes are formed at a central portion of the surface of the semiconductor element.

7. The resin sealed-type semiconductor device according to claim 1, wherein the convex outer terminals are solder bumps that are elliptical.

8. The resin sealed-type semiconductor device according to claim 7, wherein the solder bumps have greater height than a height of the sealing resin.

9. A resin sealed-type semiconductor device, comprising:

a semiconductor element;

a plurality of electrodes formed on a surface of the semiconductor element;

a plurality of leads having first and second surfaces and being disposed on the semiconductor element, wherein the first surfaces of the leads are face-to-face with the semiconductor element;

a plurality of wires which connect the electrodes with the leads;

a sealing resin which exposes areas of the second surfaces of the leads and seals the plurality of leads and the semiconductor element; and a plurality of convex outer terminals formed on the areas of the second surfaces of the leads and disposed over the surface of the semiconductor element.

10. The resin sealed-type semiconductor device according to claim 9, wherein the sealing resin exposes the areas of each of the leads which are long in the extending direction, and the sealing resin seals the plurality of leads and side surfaces of semiconductor element.

11. The resin sealed-type semiconductor device according to claim 9, wherein the leads are disposed on the semiconductor element via an insulated layer.

12. The resin sealed-type semiconductor device according to claim 9, wherein the outer terminals respectively cover substantially the entirety of the areas of the second surfaces of the leads.

13. The resin sealed-type semiconductor device according to claim 9, wherein the outer terminals which are adjacent to each other are disposed at positions which are different distances away from distal ends of the leads.

14. The resin sealed-type semiconductor device according to claim 9, wherein the plurality of electrodes are formed at a central portion of the surface of the semiconductor element.

15. The resin sealed-type semiconductor device according to claim 9, wherein the convex outer terminals are solder bumps that are elliptical.

16. The resin sealed-type semiconductor device according to claim 15, wherein the solder bumps have greater height than a height of the sealing resin.

* * * * *